United States Patent
Guo et al.

(10) Patent No.: US 11,036,901 B2
(45) Date of Patent: Jun. 15, 2021

(54) METHOD AND APPARATUS FOR SIMULATING FLEXIBLE PANEL

(71) Applicant: BOE Technology Group Co., Ltd., Beijing (CN)

(72) Inventors: Xixi Guo, Beijing (CN); Shang Chieh Chu, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 539 days.

(21) Appl. No.: 15/986,075

(22) Filed: May 22, 2018

(65) Prior Publication Data

US 2019/0163845 A1    May 30, 2019

(30) Foreign Application Priority Data

Nov. 24, 2017    (CN) .......................... 201711190986.3

(51) Int. Cl.
*G06F 30/20*    (2020.01)
*G01N 3/02*    (2006.01)
*H05K 3/00*    (2006.01)

(52) U.S. Cl.
CPC .............. *G06F 30/20* (2020.01); *G01N 3/02* (2013.01); *H05K 3/0005* (2013.01)

(58) Field of Classification Search
CPC ...... G06F 30/20; G06F 30/23; G06F 2119/06; G01N 3/02; H05K 3/0005
See application file for complete search history.

(56) References Cited

FOREIGN PATENT DOCUMENTS

| CN | 102156775 B | * | 12/2012 | |
|---|---|---|---|---|
| CN | 103245437 A | * | 8/2013 | ............ G01B 11/16 |
| CN | 103675197 A | * | 3/2014 | |
| CN | 203870599 U | * | 10/2014 | ............ G06F 3/044 |
| CN | 204155235 U | * | 2/2015 | |
| CN | 206179865 U | * | 5/2017 | |
| CN | 106935631 A | * | 7/2017 | ......... H01L 27/1218 |
| CN | 206595297 U | * | 10/2017 | |
| JP | 2005038398 | * | 2/2005 | ............ Y02T 10/82 |

* cited by examiner

*Primary Examiner* — Kandasamy Thangavelu
(74) *Attorney, Agent, or Firm* — Westman, Champlin & Koehler, P.A.

(57) ABSTRACT

The embodiments of the present disclosure provide a method and apparatus for simulating a flexible panel. The method comprises: establishing a geometric model of the flexible panel; cutting a layer adjacent to a layer where a wiring region is located in the geometric model of the flexible panel; partitioning the following regions or layers in the cut geometric model into grid cells: the wiring region, layers other than the layer where the wiring region located and the layer adjacent to the layer where the wiring region is located, and regions obtained by cutting the layer adjacent to the layer where the wiring region is located; and simulating the flexible panel based on the partition.

11 Claims, 6 Drawing Sheets

METHOD AND APPARATUS FOR SIMULATING FLEXIBLE PANEL

CROSS-REFERENCE TO RELATED APPLICATION(S)

This application claims priority to the Chinese Patent Application No. 201711190986.3, filed on Nov. 24, 2017, which is incorporated herein by reference in its entirety.

TECHNICAL FIELD

The present disclosure relates to the flexible display technology, and more particularly, to a method and apparatus for simulating a flexible panel.

BACKGROUND

Successful mass production of flexible panels not only significantly benefits the manufacturing of the new generation of high-end intelligent terminals, but also has a profound impact on applications of wearable devices due to their characteristics such as low power consumption and flexibility. The flexible panels will be widely used in the future with the continuous penetration of personal intelligent terminals. However, there are many difficulties in the development of the flexible panels, which requires a lot of manpower and material resources. For example, in the development process of the flexible panels, it is often necessary to design different test devices for different functional requirements, which consumes a lot of manpower and material resources while increasing the design difficulty.

SUMMARY

The embodiments of the present disclosure provide a method for simulating a flexible panel, comprising:
  establishing a geometric model of the flexible panel;
  cutting a layer adjacent to a layer where a wiring region is located in the geometric model of the flexible panel;
  partitioning the following regions or layers in the cut geometric model into grid cells: the wiring region, layers other than the layer where the wiring region located and the layer adjacent to the layer where the wiring region is located, and regions obtained by cutting the layer adjacent to the layer where the wiring region is located; and
  simulating the flexible panel based on the partition.

In an embodiment, the method further comprises at least one of the following steps:
  assigning material parameters to the geometric model;
  establishing a contact relationship among various layers;
  applying a simulated load to the geometric model; and
  performing stress and strain simulation analysis on the grid cells of the geometric model according to the contact relationship.

In an embodiment, the method further comprises:
  establishing an assembly after the cutting, wherein the assembly comprises all regions obtained by cutting the layer adjacent to the layer where the wiring region is located.

In an embodiment, the method further comprises: setting a symmetrical boundary condition in the geometric model.

In the embodiment, the step of performing stress and strain simulation analysis on the grid cells of the geometric model according to the contact relationship comprises: performing stress and strain simulation analysis on the grid cells of the geometric model according to the contact relationship and the symmetrical boundary condition.

In an embodiment, after the cutting, projection of a region corresponding to the wiring region on the layer adjacent to the layer where the wiring region is located onto the layer where the wiring region is located coincides with an upper surface or a lower surface of the wiring region.

In an embodiment, the step of cutting a layer adjacent to a layer where a wiring region is located in the geometric model of the flexible panel comprises: cutting the layer adjacent to the layer where the wiring region is located in the geometric model of the flexible panel using a plane which coincides with a side surface of the wiring region, wherein, the plane which coincides with the side surface of the wiring region is implemented according to a temporary coordinate system generated from a reference coordinate system.

In an embodiment, the step of cutting a layer adjacent to a layer where a wiring region is located in the geometric model of the flexible panel comprises:
  generating the temporary coordinate system from the reference coordinate system;
  causing a coordinate plane of the temporary coordinate system to coincide with a side surface of the wiring region by translating and rotating the temporary coordinate system; and
  cutting the layer adjacent to the layer where the wiring region is located using the coordinate plane of the temporary coordinate system.

In an embodiment, the step of causing a coordinate plane of the temporary coordinate system to coincide with a side surface of the wiring region by translating and rotating the temporary coordinate system comprises:
  causing an origin of the temporary coordinate system to coincide with a vertex of the side surface of the wiring region by translating the temporary coordinate system; and
  causing a direction of an axis of a coordinate plane of the temporary coordinate system to point to another vertex of the side surface of the wiring region, and causing a direction of another axis of the coordinate plane to point to yet another vertex of the side surface of the wiring region by rotating the translated temporary coordinate system.

In an embodiment, the method further comprises: causing a coordinate plane of the temporary coordinate system to be parallel to a side surface of the wiring region before causing the coordinate plane of the temporary coordinate system to coincide with the side surface of the wiring region.

The embodiments of the present disclosure propose an apparatus for simulating a flexible panel, comprising:
  a model establishment module configured to establish a geometric model of the flexible panel;
  a cutting module configured to cut a layer adjacent to a layer where a wiring region is located in the geometric model of the flexible panel;
  a partition module configured to partition the following regions or layers in the cut geometric model into grid cells: the wiring region, layers other than the layer where the wiring region located and the layer adjacent to the layer where the wiring region is located, and regions obtained by cutting the layer adjacent to the layer where the wiring region is located; and an analysis module configured to simulate the flexible panel based on the partition.

In an embodiment, the analysis module is further configured to perform at least one of the following operations:
  assigning material parameters to the geometric model;
  establishing a contact relationship among various layers;
  applying a simulated load to the geometric model; and
  performing stress and strain simulation analysis on the grid cells of the geometric model according to the contact relationship.

In an embodiment, the apparatus further comprises an assembly establishment module configured to establish an assembly after the cutting, wherein the assembly comprises all regions obtained by cutting the layer adjacent to the layer where the wiring region is located.

In an embodiment, the apparatus further comprises a constraint module configured to set a symmetrical boundary condition in the geometric model.

In the embodiment, the analysis module is further configured to: perform stress and strain simulation analysis on the grid cells of the geometric model according to the contact relationship and the symmetrical boundary condition.

In an embodiment, projection of a region corresponding to the wiring region on the layer adjacent to the layer where the wiring region is located onto the layer where the wiring region is located coincides with an upper surface or a lower surface of the wiring region.

In an embodiment, the cutting module is further configured to: cut the layer adjacent to the layer where the wiring region is located in the geometric model of the flexible panel using a plane which coincides with a side surface of the wiring region, wherein, the plane which coincides with the side surface of the wiring region is implemented according to a temporary coordinate system generated from a reference coordinate system.

In an embodiment, the cutting module is further configured to: generate the temporary coordinate system from the reference coordinate system; cause a coordinate plane of the temporary coordinate system to coincide with a side surface of the wiring region by translating and rotating the temporary coordinate system; and cut the layer adjacent to the layer where the wiring region is located using the coordinate plane of the temporary coordinate system.

In an embodiment, the cutting module is further configured to cause a coordinate plane of the temporary coordinate system to coincide with a side surface of the wiring region by performing the following operations: causing an origin of the temporary coordinate system to coincide with a vertex of the side surface of the wiring region by translating the temporary coordinate system; and causing a direction of an axis of a coordinate plane of the temporary coordinate system to point to another vertex of the side surface of the wiring region, and causing a direction of another axis of the coordinate plane to point to yet another vertex of the side surface of the wiring region by rotating the translated temporary coordinate system.

In an embodiment, the cutting module is further configured to: cause a coordinate plane of the temporary coordinate system to be parallel to a side surface of the wiring region before causing the coordinate plane of the temporary coordinate system to coincide with the side surface of the wiring region.

Other features and advantages of the present disclosure will be set forth in the description which follows, and will partly be obvious from the description, or may be learned by practice of the present disclosure. The purposes and other advantages of the present disclosure can be realized and obtained by the structure particularly pointed out in the description, the claims and the accompanying drawings.

BRIEF DESCRIPTION OF THE DRAWINGS

The accompanying drawings are used to provide a further understanding of the technical solutions of the present disclosure, and constitute a part of the specification. The accompanying drawings are used together with the embodiments of the present application to explain the technical solutions of the present disclosure, and do not constitute limitations on the technical solutions of the present disclosure.

DETAILED DESCRIPTION

The embodiments of the present disclosure will be described in detail below with reference to the accompanying drawings. It should be illustrated that, the embodiments in the present application and the features in the embodiments can be combined with each other randomly without a conflict.

The steps illustrated in the flowcharts of the accompanying drawings may be performed in a computer system such as a set of computer-executable instructions. Further, although a logical order is shown in the flowcharts, in some cases, the illustrated or described steps may be performed in an order different from the order here.

In a related method for simulating a flexible panel, the flexible panel is regarded as a multi-layer structure including a wiring region layer, and simulation calculation is implemented by performing operations such as modeling, grid partition, etc. on this multi-layer structure. However, due to the contact of many discrete the wiring region with consecutive layers, phenomenon such as irregularities in grid partition occur near contact surfaces between the wiring regions and the adjacent consecutive layers, which seriously affects results of the simulation.

Figure 1:
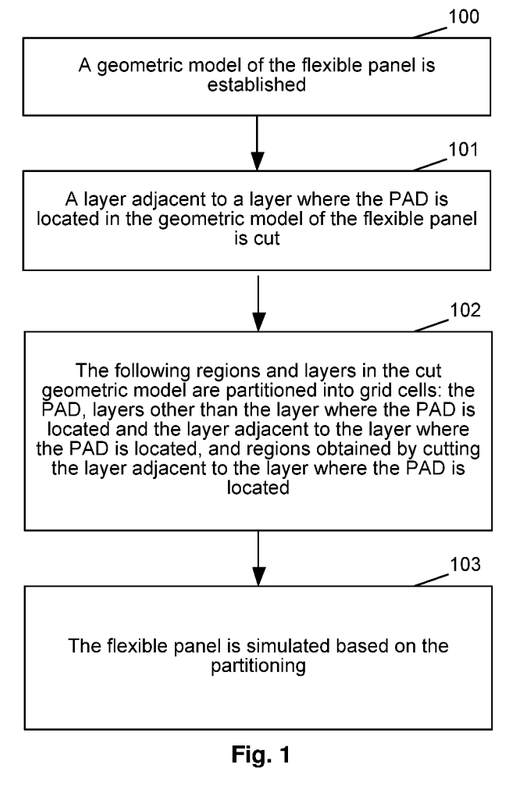
FIG. 1 is a flowchart of a method for simulating a flexible panel according to an embodiment of the present disclosure.

FIG. 1 illustrates a flowchart of a method for simulating a flexible panel according to an embodiment of the present disclosure. It can be seen from FIG. 1 that the method comprises steps 100-103.

Specifically, in step 100, a geometric model of the flexible panel is established.

In the present embodiment, establishing the geometric model of the flexible panel refers to establishing all the layer structures of the flexible panel and a connection relationship between adjacent layer structures.

Figure 3:
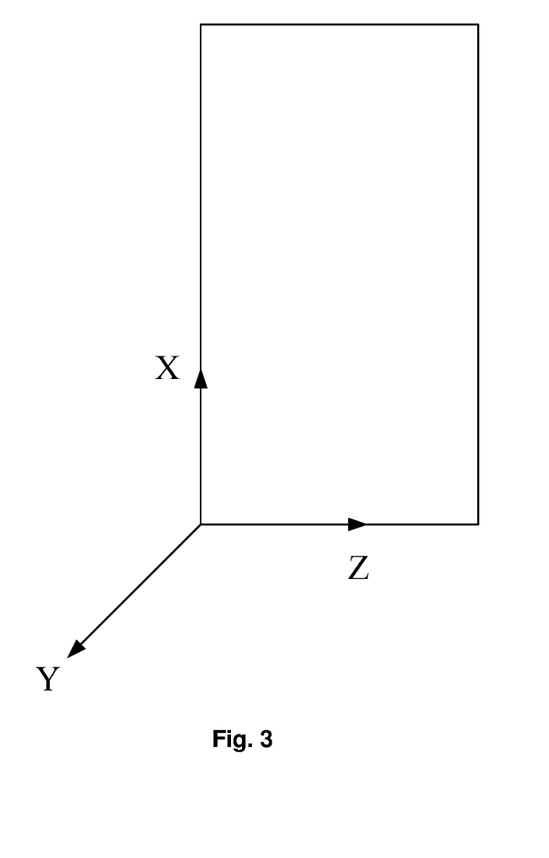
FIG. 3 is a diagram of a flexible panel before the flexible panel is cut according to an embodiment of the present disclosure.

In the present embodiment, a position of the established geometric model of the flexible panel in a reference coordinate system may be arbitrary. For example, as shown in FIG. 3, a Y-axis of the reference coordinate system may be along a direction of a stack of layers of the flexible panel, and a Y-axis coordinate of a top layer of the flexible panel is greater than a Y-axis coordinate of a bottom layer of the flexible panel. It should be illustrated that a position of the reference coordinate system relative to the geometric model of the flexible panel shown in FIG. 3 is only an example, and is not used to limit the protection scope of the embodiments of the present disclosure. The following description is given using this relative position relationship, and implementation processes for other relative position relationships are similar thereto and will not be repeated here.

In step 101, a layer adjacent to a layer where the wiring region is located in the geometric model of the flexible panel is cut.

In the present embodiment, after the layer adjacent to the layer where the wiring region is located is cut, projection of a region corresponding to the wiring region on the layer adjacent to the layer where the wiring region is located on the layer where the wiring region is located coincides with an upper surface or a lower surface of the wiring region.

Specifically, the layer adjacent to the layer where the wiring region is located in the geometric model of the flexible panel may be cut using a plane which coincides with a side surface of the wiring region.

Figure 2:
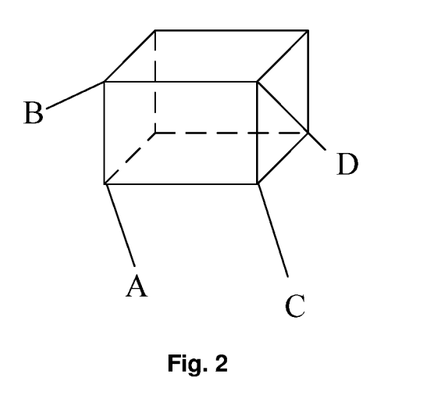
FIG. 2 is a diagram of a wiring region in a flexible panel according to an embodiment of the present disclosure.

Generally, as shown in FIG. 2, the wiring region has six surfaces, i.e., an upper surface, a lower surface, and four side surfaces which are a front side surface, a rear side surface, a left side surface, and a right side surface. The upper surface and the lower surface are perpendicular to a normal direction of the flexible panel, and the four side surfaces are parallel to the normal direction of the flexible panel.

Specifically, a layer adjacent to a layer where each wiring region is located in the geometric model of the flexible panel is cut sequentially using a plane which coincides with each side surface of the wiring region.

Each of the side surfaces is generally a plane, and therefore a plane which coincides with the side surface of the wiring region may be a coordinate plane of a temporary coordinate system generated from the reference coordinate system, which coincides with the side surface of the wiring region. A specific cutting method will be described in detail below.

A process of cutting the geometric model of the flexible panel using a plane which coincides with a certain side surface of a certain wiring region comprises: generating a temporary coordinate system from the reference coordinate system; causing a coordinate plane of the temporary coordinate system to coincide with a side surface of the wiring region by translating and rotating the temporary coordinate system; and cutting the layer adjacent to the layer where the wiring region is located using the coordinate plane of the temporary coordinate system.

For example, a temporary coordinate system is firstly generated from the reference coordinate system, wherein the temporary coordinate system may be a copy of the reference coordinate system. Relative positions between the temporary coordinate system and the reference coordinate system may be arbitrary, which is not limited in the embodiments of the present disclosure.

Then, an origin of the temporary coordinate system is caused to coincide with a vertex of a side surface of the wiring region by translating the temporary coordinate system.

Then, a direction of an axis of a coordinate plane of the temporary coordinate system is caused to point to another vertex of the side surface of the wiring region, and a direction of another axis of the coordinate plane is caused to point to yet another vertex of the side surface of the wiring region by rotating the translated temporary coordinate system.

A vertex of a side surface generally refers to an endpoint of a boundary where the side surface of the wiring region intersects another surface of the wiring region. As shown in FIG. 2, a front side surface of the wiring region has four vertexes, which are vertex A, vertex B, vertex C and vertex D. The same is true for vertexes of other side surfaces.

A direction of an axis of the temporary coordinate system points to another vertex of the side surface of the wiring region, and a direction of another axis points to yet another vertex of the side surface of the wiring region. That is, two axises of the temporary coordinate system are boundaries where the side surface intersects the lower surface or the upper surface or other side surfaces. In this case, a coordinate plane of the temporary coordinate system coincides with the side surface.

Before the cutting is performed, the layer adjacent to the layer where the wiring region is located is a complete rectangular structure, as shown in FIG. 3.

After the cutting is performed, the layer adjacent to the layer where the wiring region is located is partitioned into a plurality of regions including the region corresponding to the wiring region and a plurality of remaining regions. Contact surfaces between the region corresponding to the wiring region and the upper surface or the lower surface of the wiring region have the same sizes as those of the upper surface or the lower surface of the wiring region, and are used to set a contact relationship between the region and the upper surface or the lower surface of the wiring region.

Figure 5A:
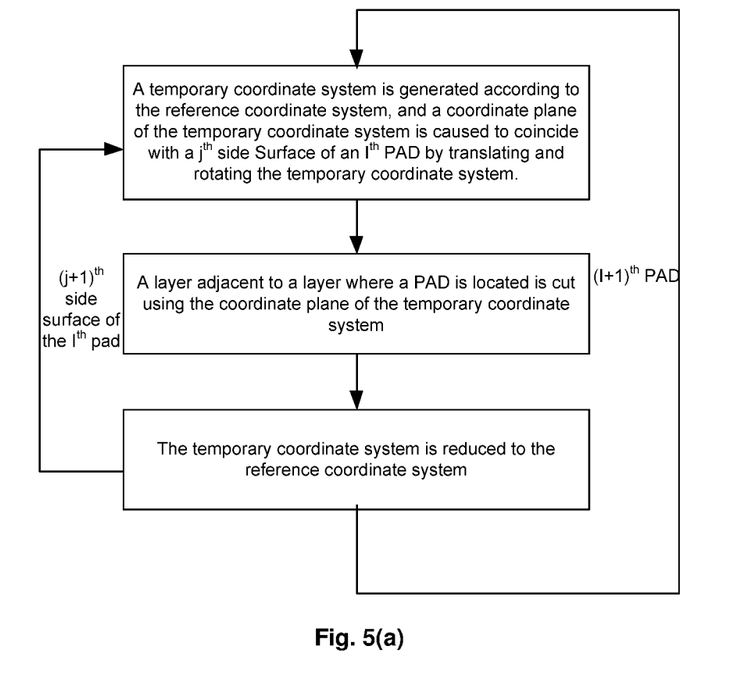
FIG. 5(a) is a flowchart of cutting a flexible panel according to an embodiment of the present disclosure.
Figure 5B:
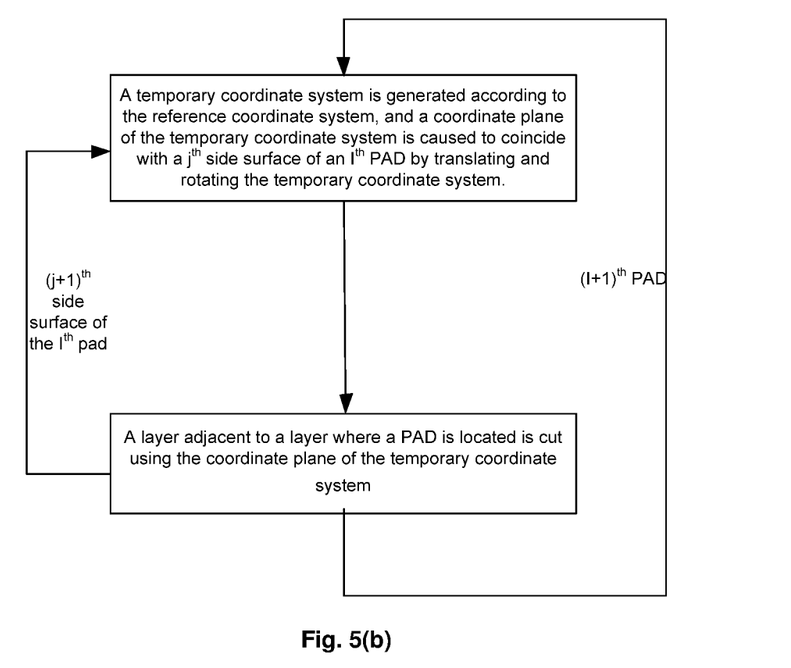
FIG. 5(b) is a flowchart of cutting a flexible panel according to an embodiment of the present disclosure.

In addition, after each time a layer adjacent to the layer where the wiring region is located in the geometric model of the flexible panel is cut using a current side surface, the temporary coordinate system may be reduced to the reference coordinate system, as shown in FIG. 5($a$), or the temporary coordinate system may also not be reduced to the reference coordinate system, as shown in FIG. 5($b$).

Figure 4A:
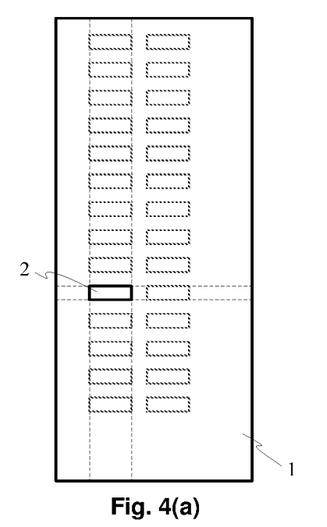
FIG. 4(a) is a diagram of cutting a flexible panel according to an embodiment of the present disclosure.
Figure 4B:
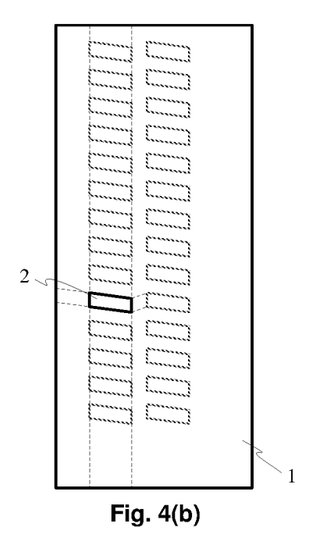
FIG. 4(b) is a diagram of cutting a flexible panel according to an embodiment of the present disclosure.

FIGS. 4($a$) and 4($b$) illustrate diagrams of cutting a flexible panel according to an embodiment of the present disclosure respectively. It can be seen from the figures that there are a plurality of wiring regions 2 arranged in the flexible panel 1. An upper surface or a lower surface of the wiring region may have various shapes such as a circle, a rectangle (as shown in FIG. 4($a$)), a parallelogram (as shown in FIG. 4($b$)), a diamond, a trapezoid, a square, etc. FIG. 4($a$) illustrates only a rectangle as an example, and FIG. 4($b$) illustrates only a parallelogram as an example. The shape of the upper surface or the lower surface of the wiring region is not limited in the present embodiment, and a specific shape is not used to limit the protection scope of the embodiments of the present disclosure, which will not be repeated here.

It should be illustrated here that FIGS. 4($a$) and 4($b$) illustrate only a half of the geometric model of the flexible panel, and the other half of the geometric model of the flexible panel has a symmetrical relationship with the half shown in the figures (for example, the two halves are located on two opposite sides of the flexible panel, respectively).

As the shape of the wiring region is not limited, if at least one side surface of the wiring region is not parallel to any coordinate plane of the reference coordinate system, a coordinate plane of the temporary coordinate system needs to be firstly caused to be parallel to a side surface of the wiring region by rotating the temporary coordinate system, and then the coordinate plane of the temporary coordinate system needs to be caused to coincide with the side surface of the wiring region by translating and rotating the temporary coordinate system.

In the above method, when the layer adjacent to the layer where the wiring region is located is cut using a coordinate plane of the temporary coordinate system, the layer adjacent to the layer where the wiring region is located should be cut using the entire coordinate plane, as indicated by dotted lines shown in FIGS. 4(a) and 4(b). In the figures, the dotted lines are only used to highlight the partition effects, and in fact, after the layer adjacent to the layer where the wiring region is located is partitioned, a corresponding region which is directly below or above the wiring region has the same contact surface as that of the wiring region, which is used to set a contact relationship therebetween.

In step 102, the following regions and layers in the cut geometric model are partitioned into grid cells: the wiring region, layers other than the layer where the wiring region is located and the layer adjacent to the layer where the wiring region is located, and regions obtained by cutting the layer adjacent to the layer where the wiring region is located.

In the present embodiment, when grid partition is performed, grid cells which are obtained by partitioning different wiring regions, grid cells which are obtained by partitioning layers other than the layer where the wiring region is located and the layer adjacent to the layer where the wiring region is located, and grid cells which are obtained by partitioning different regions obtained by cutting the layer adjacent to the layer where the wiring region is located may have the same size or different sizes. The smaller the grid cells which are obtained by partition, the higher the simulation accuracy and the greater the computational complexity.

In an embodiment, only a region corresponding to the wiring region in different regions obtained by cutting the layer adjacent to the layer where the wiring region is located may be partitioned into grids.

In another embodiment, all the regions obtained by cutting the adjacent layer (including the region corresponding to the wiring region and the remaining regions) may be partitioned into grids. It should be pointed out that grids obtained by partitioning the region corresponding to the wiring region and the remaining regions may have different sizes and/or shapes.

In general, the shapes and sizes of the grid cells which are obtained by partition are not limited in the present embodiment. For example, the grid cells may have a shape of square, rectangle, triangle, etc.

The method for cutting the layer adjacent to the layer where the wiring region is located in the geometric model of the flexible panel can effectively avoid the problem of irregular shapes of the grid cells in the subsequent grid partition process, improve the quality of the grid cells, and enhance the success rate of the partition, thereby reducing the computational complexity of the subsequent finite element analysis.

In step 103, the flexible panel is simulated based on the partition.

Specifically, in step 103, the flexible panel may be simulated by at least one of the following steps: assigning material parameters to the geometric model; establishing a contact relationship among various layers; applying a simulated load to the geometric model; and performing stress and strain simulation analysis on the grid cells of the geometric model according to the contact relationship.

In the present embodiment, the material parameters comprise materials, elastic modulus, and thicknesses of all layers on the flexible panel.

In the present embodiment, the assignment of the material parameters to the geometric model may be performed before step 101, or between step 101 and step 102, or between step 102 and the establishment of the contact relationship among various layers.

In the present embodiment, the contact relationship among various layers comprises a contact relationship between the upper surface of the wiring region and a layer which is located above the layer where the wiring region is located and is adjacent to the layer where the wiring region is located, a contact relationship between the lower surface of the wiring region and a layer which is located below the layer where the wiring region is located and is adjacent to the layer where the wiring region is located, and a contact relationship between a layer in the flexible panel other than the layer where the wiring region is located and the layer adjacent to the layer where the wiring region is located and an adjacent layer thereof. When there is a coupling surface in the structure of the geometric model of the flexible panel, there may also be other contact relationships.

Figure 6A:
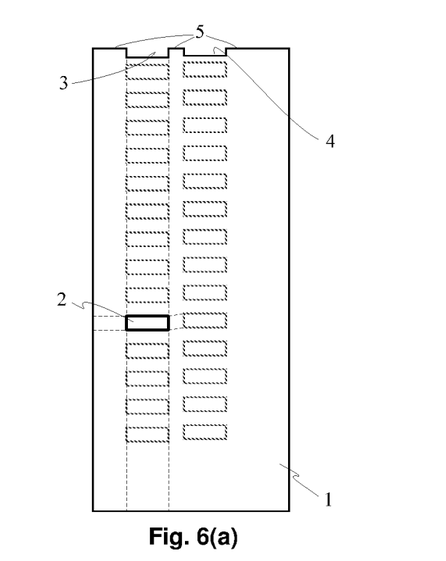
FIG. 6(a) is a diagram of cutting a flexible panel according to an embodiment of the present disclosure.
Figure 6B:
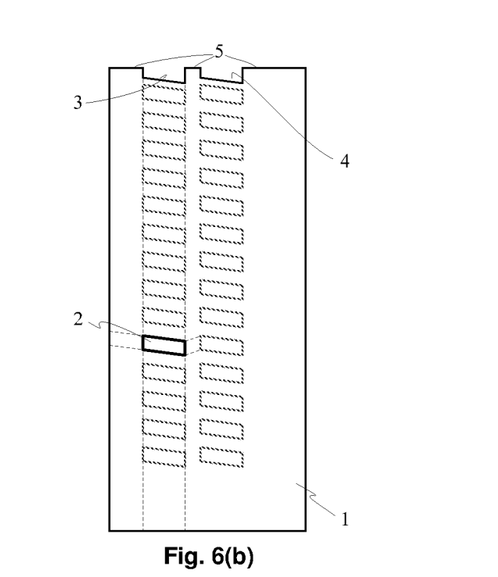
FIG. 6(b) is a diagram of cutting a flexible panel according to an embodiment of the present disclosure.

For example, FIGS. 6(a) and 6(b) are diagrams of cutting a flexible panel when there are coupling surfaces according to an embodiment of the present disclosure. In FIGS. 6(a) and 6(b), there are coupling surfaces 3 and 4 at a symmetrical boundary 5. The symmetrical boundary is a place where a symmetrical boundary condition may be applied. The symmetrical boundary condition may be applied at the symmetrical boundary, so that only a part (for example, a half) of the entire structure can be simulated, thereby greatly reducing the computational complexity.

When the wiring region is divided by the symmetrical boundary into two equal parts, upper surfaces of the wiring region on both sides of the symmetrical boundary are coupling surfaces. In this case, the contact relationship further comprises a contact relationship between the coupling surfaces and the layer which is located above the layer where the wiring region is located and is adjacent to the layer where the wiring region is located.

The above contact relationship may be expressed using the following constraint conditions.

$$\begin{cases} ROT_{XY} = 0 \\ ROT_{YZ} = 0 \end{cases}$$

wherein, $ROT_{XY}=0$ indicates that a rotational degree of freedom of a grid cell in an XoY plane of the reference coordinate system is 0, and $ROT_{YZ}=0$ indicates that a rotational degree of freedom of a grid cell in an YoZ plane of the reference coordinate system is 0.

In addition, a constraint condition of the lowest layer of the flexible panel is that all of the translational degrees of freedom and all of the rotational degrees of freedom are 0.

In the present embodiment, after the contact relationship of each grid cell is input, a simulated load is applied to the geometric model, so that the stress and strain simulation analysis is performed on the flexible panel.

In the present embodiment, the simulated load may be a uniform force or a concentrated force. The uniform force means that the same force is applied at all positions on a certain surface of the flexible panel, and the concentrated force means that a force is applied to a certain point on a certain surface of the flexible panel.

The uniform force and the concentrated force may be applied for a long time or a short time. When the force is applied, the uniform force and the concentrated force may remain the same or may change over time.

After a displacement of each grid cell is solved according to the simulated load and the boundary condition, a deformation condition of each layer of the geometric model, and a displacement condition and a stress condition of any point may be viewed as needed. The any point refers to any point on the geometric model of the flexible panel. When the point is selected, it should try to select a point at a vertex position of the grid cell, thereby obtaining a displacement condition and a deformation condition of any cross section. In order to investigate the overall deformation condition of a contact surface corresponding to the cross section, it needs to firstly establish the cross section, and then extract and average displacements of various grid cells on the cross section, so as to obtain average stress and strain of the cross section.

In the present embodiment, the stress and strain simulation analysis of the flexible panel may be drawing of a deformation pattern of the flexible panel, or a deformation response and a stress and strain response of a certain point on the flexible panel.

In an embodiment, a symmetric boundary condition of the geometric model may also be established, so that the stress and strain simulation analysis is performed on the grid cells of the geometric model according to the contact relationship and the symmetric boundary condition. In this way, only a half of calculations needs to be performed in the subsequent stress and strain simulation analysis, which reduces the computational complexity and improves the simulation efficiency.

In an embodiment, the method further comprises:

after cutting the layer adjacent to the layer where the wiring region is located in the geometric model of the flexible panel, establishing an assembly, wherein the assembly comprises all regions obtained by cutting the layer adjacent to the layer where the wiring region is located. This facilitates subsequent processing (such as the partition of grid cells, establishment of contact relationships, etc.)

All the above calculation processes may be replaced by APDL (ANSYS Parametric Design Language) command flow files, which are written using the secondary development language of the large finite element software ANSYS. Specific parameters of the APDL command flow files, such as sizes of the grid cells, geometric boundary conditions, loading order and post-processing extraction results, etc., may be changed for solving.

The APDL language greatly improves the simulation efficiency of the flexible panel and therefore can improve the design efficiency. When the geometric structure of the flexible panel is changed or design functions are added, simulation experiments may be performed using the method according to the embodiments of the present disclosure. Specifically, simulation calculations are performed according to different initial boundaries and load boundaries (i.e., applied external forces), to perform fast solving and obtain results of the solution, which reduces the design cost.

The method according to the embodiments of the present disclosure can perform numerical simulation according to design requirements, to simulate various test schemes, such as a bending test, a point-touch test, a tensile test, etc. of the flexible panel, which reduces the test time, saves the test expenses, and greatly shorten the design cycle.

When there are different structures of flexible panels, transverse comparisons of these products can be performed according to embodiments of the present disclosure, and equivalent numerical simulations are performed according to the different structures of the flexible panels to compare stress and strain conditions, which is beneficial to optimize the design. Generally, the material of the flexible panel is relatively expensive, and with the method according the embodiments of the present disclosure, the intensity of the test can be reduced, which is equivalent to reducing the cost of material consumption.

The method according the embodiments of the present disclosure can also find potential problems in advance before the flexible panel is manufactured, simulate problems which may occur in the manufacturing process of the flexible panel according to different boundary conditions, and solve and improve structural problems of the flexible panel. Further, the method according to the embodiments of the present disclosure can also perform numerical simulations for some problems which have arisen and find ways to optimize and improve the problems.

Figure 7:
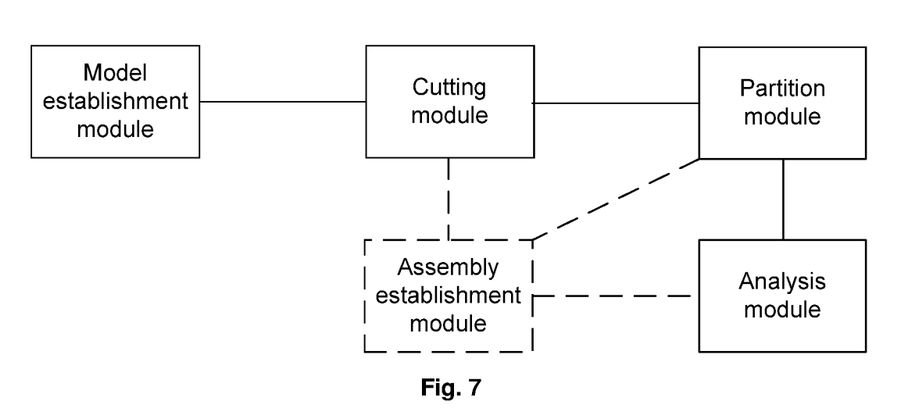
FIG. 7 is a diagram of a structural composition of an apparatus for simulating a flexible panel according to another embodiment of the present disclosure.

As shown in FIG. 7, another embodiment of the present disclosure proposes an apparatus for simulating a flexible panel, comprising:

a model establishment module configured to establish a geometric model of the flexible panel;

a cutting module configured to cut a layer adjacent to a layer where a wiring region is located in the geometric model of the flexible panel;

a partition module configured to partition the following regions or layers in the cut geometric model into grid cells: the wiring region, layers other than the layer where the wiring region located and the layer adjacent to the layer where the wiring region is located, and regions obtained by cutting the layer adjacent to the layer where the wiring region is located; and an analysis module configured to simulate the flexible panel based on the partition.

In an embodiment, the analysis module is further configured to perform at least one of the following operations: assigning material parameters to the geometric model; establishing a contact relationship among various layers; applying a simulated load to the geometric model; and performing stress and strain simulation analysis on the grid cells of the geometric model according to the contact relationship.

In an embodiment, the apparatus further comprises an assembly establishment module configured to establish an assembly after the cutting. The assembly comprises all regions obtained by cutting the layer adjacent to the layer where the wiring region is located.

In an embodiment, the apparatus further comprises a constraint module configured to set a symmetrical boundary condition in the geometric model.

In the embodiment, the analysis module is further configured to: perform stress and strain simulation analysis on the grid cells of the geometric model according to the contact relationship and the symmetrical boundary condition.

In an embodiment, projection of a region corresponding to the wiring region on the layer adjacent to the layer where the wiring region is located onto the layer where the wiring region is located coincides with an upper surface or a lower surface of the wiring region.

In an embodiment, the cutting module is further configured to: cut the layer adjacent to the layer where the wiring region is located in the geometric model of the flexible panel using a plane which coincides with a side surface of the wiring region, In an embodiment, the plane which coincides with the side surface of the wiring region is implemented according to a temporary coordinate system generated from a reference coordinate system.

In an embodiment, the cutting module is further configured to: generate the temporary coordinate system from the reference coordinate system; cause a coordinate plane of the temporary coordinate system to coincide with a side surface of the wiring region by translating and rotating the temporary coordinate system; and cut the layer adjacent to the layer where the wiring region is located using the coordinate plane of the temporary coordinate system.

In an embodiment, the cutting module is further configured to cause a coordinate plane of the temporary coordinate system to coincide with a side surface of the wiring region by performing the following operations: causing an origin of the temporary coordinate system to coincide with a vertex of the side surface of the wiring region by translating the temporary coordinate system; and causing a direction of an axis of a coordinate plane of the temporary coordinate system to point to another vertex of the side surface of the wiring region, and causing a direction of another axis of the coordinate plane to point to yet another vertex of the side surface of the wiring region by rotating the translated temporary coordinate system.

In an embodiment, the cutting module is further configured to: cause a coordinate plane of the temporary coordinate system to be parallel to a side surface of the wiring region before causing the coordinate plane of the temporary coordinate system to coincide with the side surface of the wiring region.

In an embodiment, the grid cells have a shape of square, rectangle, or triangle.

In an embodiment, the material parameters comprise materials, elastic modulus, and thicknesses of all layers on the flexible panel.

Although the embodiments of the present disclosure are disclosed as above, the contents described are merely embodiments used for facilitating the understanding of the present disclosure and are not intended to limit the present disclosure. Any person skilled in the art to which the present disclosure pertains can make any modifications and changes in the form and details of implementations without departing from the spirit and scope disclosed in the present disclosure, but the patent protection scope of the present disclosure should still be defined by the scope of the attached claims.

We claim:

1. A method for simulating a flexible panel, comprising:
establishing a geometric model of the flexible panel;
cutting a layer adjacent to a layer where a wiring region is located in the geometric model of the flexible panel;
partitioning the following regions or layers in the cut geometric model into grid cells: the wiring region, layers other than the layer where the wiring region located and the layer adjacent to the layer where the wiring region is located, and regions obtained by cutting the layer adjacent to the layer where the wiring region located;
simulating the flexible panel based on the partition; and
determining stress and strain distribution on the flexible panel.

2. The method according to claim 1, further comprising at least one of the following steps:
assigning material parameters to the geometric model;
establishing a contact relationship among various layers;
applying a simulated load to the geometric model; and
performing stress and strain simulation analysis on the grid cells of the geometric model according to the contact relationship.

3. The method according to claim 2, further comprising setting a symmetrical boundary condition in the geometric model,
wherein the step of performing stress and strain simulation analysis on the grid cells of the geometric model according to the contact relationship comprises:
performing stress and strain simulation analysis on the grid cells of the geometric model according to the contact relationship and the symmetrical boundary condition.

4. The method according to claim 1, further comprising:
establishing an assembly after the cutting, wherein the assembly comprises all regions obtained by cutting the layer adjacent to the layer where the wiring region is located.

5. The method according to claim 1, further comprising setting a symmetrical boundary condition in the geometric model.

6. The method according to claim 1, wherein after the cutting, projection of a region corresponding to the wiring region on the layer adjacent to the layer where the wiring region is located onto the layer where the wiring region is located coincides with an upper surface or a lower surface of the wiring region.

7. The method according to claim 6, wherein the step of cutting a layer adjacent to a layer where a wiring region is located in the geometric model of the flexible panel comprises:
cutting the layer adjacent to the layer where the wiring region is located in the geometric model of the flexible panel using a plane which coincides with a side surface of the wiring region,
wherein the plane which coincides with the side surface of the wiring region is implemented according to a temporary coordinate system generated from a reference coordinate system.

8. The method according to claim 7, wherein the step of cutting a layer adjacent to a layer where a wiring region is located in the geometric model of the flexible panel comprises:
generating the temporary coordinate system from the reference coordinate system;
causing a coordinate plane of the temporary coordinate system to coincide with a side surface of the wiring region by translating and rotating the temporary coordinate system; and
cutting the layer adjacent to the layer where the wiring region is located using the coordinate plane of the temporary coordinate system.

9. The method according to claim 8, wherein the step of causing a coordinate plane of the temporary coordinate system to coincide with a side surface of the wiring region by translating and rotating the temporary coordinate system comprises:
causing an origin of the temporary coordinate system to coincide with a vertex of the side surface of the wiring region by translating the temporary coordinate system; and
causing a direction of an axis of a coordinate plane of the temporary coordinate system to point to another vertex of the side surface of the wiring region, and causing a direction of another axis of the coordinate plane to point to yet another vertex of the side surface of the wiring region by rotating the translated temporary coordinate system.

10. The method according to claim 8, further comprising:
causing a coordinate plane of the temporary coordinate system to be parallel to a side surface of the wiring region before causing the coordinate plane of the temporary coordinate system to coincide with the side surface of the wiring region.

11. An apparatus for simulating a flexible panel, comprising:
a computer system with one or more processors and a memory storing executable instructions for:
establishing a geometric model of the flexible panel;
cutting a layer adjacent to a layer where a wiring region is located in the geometric model of the flexible panel;
partitioning the following regions or layers in the cut geometric model into grid cells: the wiring region, layers other than the layer where the wiring region located and the layer adjacent to the layer where the wiring region is located, and regions obtained by cutting the layer adjacent to the layer where the wiring region is located;
simulating the flexible panel based on the partition; and
determining stress and strain distribution on the flexible panel.

\* \* \* \* \*